United States Patent
Shin

(10) Patent No.: US 8,084,317 B2
(45) Date of Patent: Dec. 27, 2011

(54) SEMICONDUCTOR DEVICE AND METHOD OF MANUFACTURING THE SAME

(75) Inventor: Eun Jong Shin, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 90 days.

(21) Appl. No.: 12/503,815

(22) Filed: Jul. 15, 2009

(65) Prior Publication Data

US 2010/0019323 A1    Jan. 28, 2010

(30) Foreign Application Priority Data

Jul. 25, 2008    (KR) .................. 10-2008-0073164

(51) Int. Cl.
*H01L 21/8238* (2006.01)
*H01L 21/336* (2006.01)

(52) U.S. Cl. .............. 438/218; 438/286; 257/E21.335

(58) Field of Classification Search .......... 438/286, 438/163, 525, 216, 305, 218; 257/344, 369, 257/288, E21.335, E21.345, E29.063, E29.268
See application file for complete search history.

(56) References Cited

U.S. PATENT DOCUMENTS

| | | | |
|---|---|---|---|
| 7,282,426 B2 | 10/2007 | Mathew et al. | |
| 7,638,399 B2* | 12/2009 | Tsujii | 438/286 |
| 2008/0233694 A1* | 9/2008 | Li | 438/216 |
| 2010/0244106 A1* | 9/2010 | Parker et al. | 257/288 |

OTHER PUBLICATIONS

Korean Office Action dated Jun. 1, 2010; Korean Patent Application No. 10-2008-0073164; Korean Intellectual Property Office, Republic of Korea.

* cited by examiner

*Primary Examiner* — Walter L Lindsay, Jr.
(74) *Attorney, Agent, or Firm* — The Law Offices of Andrew D. Fortney; Andrew D. Fortney; Anthony R. Jimenez

(57) ABSTRACT

Provided are a semiconductor device and a method of manufacturing the same. The semiconductor device comprises a gate electrode on a semiconductor substrate having a device isolation region, a first drain spacer on one side of the gate electrode, a second drain spacer next to the first drain spacer, a first source spacer on an opposite side of the gate electrode and a portion of the semiconductor substrate where a source region is to be formed, a second source spacer on side and top surfaces of the first source spacer, and LDDs adjacent to the first drain spacer and below the first source spacers, wherein the LDD below the first source spacer is thinner than the LDD adjacent to the first drain spacer.

12 Claims, 5 Drawing Sheets

SEMICONDUCTOR DEVICE AND METHOD OF MANUFACTURING THE SAME

CROSS-REFERENCE TO RELATED APPLICATIONS

The present application claims priority under 35 U.S.C. 119 and 35 U.S.C. 365 to Korean Patent Application No. 10-2008-0073164 (filed on Jul. 25, 2008), which is hereby incorporated by reference in its entirety.

BACKGROUND

FIGS. 1 to 3 are views illustrating manufacturing processes of a symmetric semiconductor device.

Referring to FIG. 1, a device isolation region 11 is formed in a semiconductor substrate 10 through a Shallow Trench Isolation (STI) technique, and then an insulation layer 12 and a polysilicon layer 13 are stacked thereon. Based on the device isolation region 11, one side of the semiconductor substrate 10 is a region where an N-type Metal Oxide Semiconductor (NMOS) device is to be formed, and the other side of the semiconductor substrate 10 is a region where a P-type MOS (PMOS) device is to be formed.

As shown in FIG. 2, gate insulation layers 12a and 12b and gate electrodes 13a and 13b are formed in the NMOS region and the PMOS region, respectively, by patterning the insulation layer 12 and the polysilicon layer 13. Then, symmetric Lightly Doped Drain (LDD) regions 14a and 14b are formed through an ion implantation process.

Next, as shown in FIG. 3, spacers 16a and 16b are formed on the sidewalls of the gate electrodes 13a and 13b, and source and drain regions 15a and 15b are formed in each of the NMOS region and PMOS region through an ion implantation process. However, the following limitations may occur due to the structure of the symmetric semiconductor device.

First, the symmetric LDD structure, where source and drain terminals adjacent to opposed sides of the gates have the same size, may cause characteristic sub-threshold deterioration, and due to this, the drive current becomes lower in a saturation state.

Second, in an inversion mode (where sub-threshold current[s] occur), an LDD region of the source terminal may adversely affect the swing characteristic[s] of the device, and the parasitic capacitance of an overlapping portion of the gate and the LDD region may slow down an operational speed of the device. For example, in a flip-flop circuit that includes symmetric semiconductor devices, due the influence of the drive current and the capacitance(s), an edge portion of a swing characteristic graph may not have a vertical structure, but rather, may have a parabolic structure. Additionally, the propagation delay time may increase. Since the propagation delay time is proportional to the capacitance and is inversely proportional to the drive current of each MOS region, there may be a limitation in reducing the propagation delay time in a circuit including the symmetric semiconductor device(s).

Third, the junction depth of the active region is a very important factor for controlling the line width of the device and the effective channel length of a gate electrode. Therefore, the junction depth may be adjusted using In/Sb (e.g., heavy) ion implantation and Laser Spike Anneal (LSA) processes.

However, even if the junction depth is adjusted through the above techniques, the Short Channel Effect (SCE) and Reverse Short Channel Effects (RSCE) such as Gate Induced Drain Leakage (GIDL) and Drain Induced Barrier Lowering (DIBL) may occur.

Additionally, since the drive voltage is relatively high in comparison to the size of a highly-integrated semiconductor device, an injected electron may intensely accelerate in or near a source region due to the potential gradient state of the drain. Also, Hot Carrier Instability (HCI) phenomena may occur. Therefore, it becomes very difficult to control the threshold voltage of a symmetric semiconductor device.

SUMMARY

Embodiments of the present invention provide a semiconductor device having an asymmetric source/drain structure with an LDD region. Therefore, provided are a semiconductor device capable of preventing deterioration of sub-threshold characteristics and reduction(s) in drive current in a saturation state, and method(s) of manufacturing the same.

Embodiments of the invention also provide a semiconductor device with a structure that suppresses or prevents the deterioration of a swing characteristic of a device and the occurrence of a parasitic capacitance in the overlap between a gate and an LDD region in an inversion mode where a sub-threshold current occurs, and a method of manufacturing the same.

Embodiments of the invention also provide a semiconductor device capable of minimizing the Short Channel Effect (SCE), the Reverse Short Channel Effect (RSCE), and Hot Carrier Instability (HCI), and capable of controlling a threshold voltage without difficulties, and a method of manufacturing the same.

In one aspect, a semiconductor device may comprise a gate electrode on a semiconductor substrate having a device isolation region; a first drain spacer on one side of the gate electrode; a second drain spacer next to the first drain spacer; a first source spacer on an opposite side of the gate electrode and on a portion of the semiconductor substrate adjacent to a source region; a second source spacer on the side and top of the first source spacer; and an LDD on the side of the first drain spacer and in the semiconductor substrate below the first and second source spacers, wherein the LDD region below the first source spacer is thinner than the LDD region the first drain spacer.

In another aspect, a method of manufacturing a semiconductor device may comprise forming a gate electrode on a semiconductor substrate having a device isolation region; forming a first drain spacer on one side of the gate electrode and forming a first spacer layer on an opposite side of the gate electrode and on the semiconductor substrate where a source region is to be formed; forming an asymmetric Lightly Doped Drain (LDD) region by implanting ions on the exposed semiconductor substrate next to the first drain spacer and implanting ions that penetrate the first spacer layer where the source region is to be formed; forming a second spacer next to the first drain spacer, partially removing the first spacer layer of the semiconductor substrate where the source region is to be formed, to allow a remaining portion of the first spacer layer to form a first source spacer, and forming a second source spacer on a side and top surface of the first source spacer.

The details of one or more embodiments are set forth in the accompanying drawings and the description below. Other features will be apparent from the description and drawings, and from the claims.

DETAILED DESCRIPTION OF THE EMBODIMENTS

A semiconductor device and a method of manufacturing the same according to various embodiments will be described in detail with reference to the accompanying drawings.

Hereinafter, during the description about one or more exemplary embodiments, detailed descriptions related to well-known functions or configurations will be omitted in order not to obscure the subject matter of the present invention. Thus, core components related to the technical scope of the present invention will be discussed in detail below.

In the description of such embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

Figure 1:
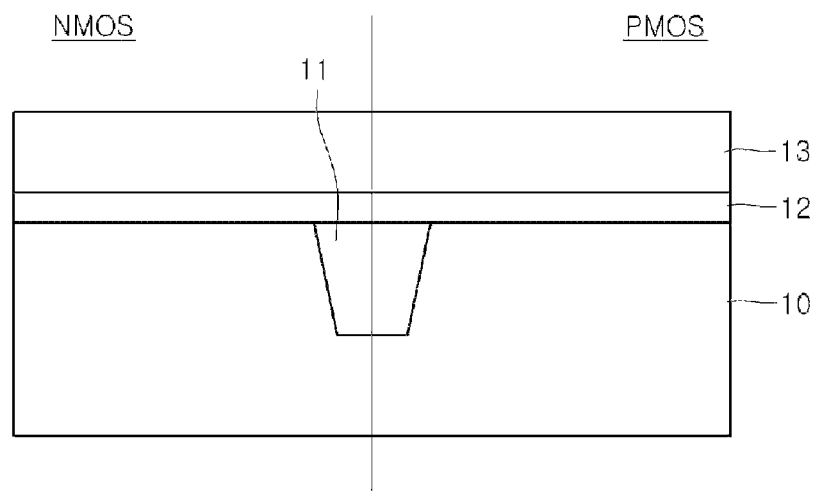
FIGS. 1 to 3 are views illustrating an exemplary manufacturing process for a symmetric semiconductor device.
Figure 2:
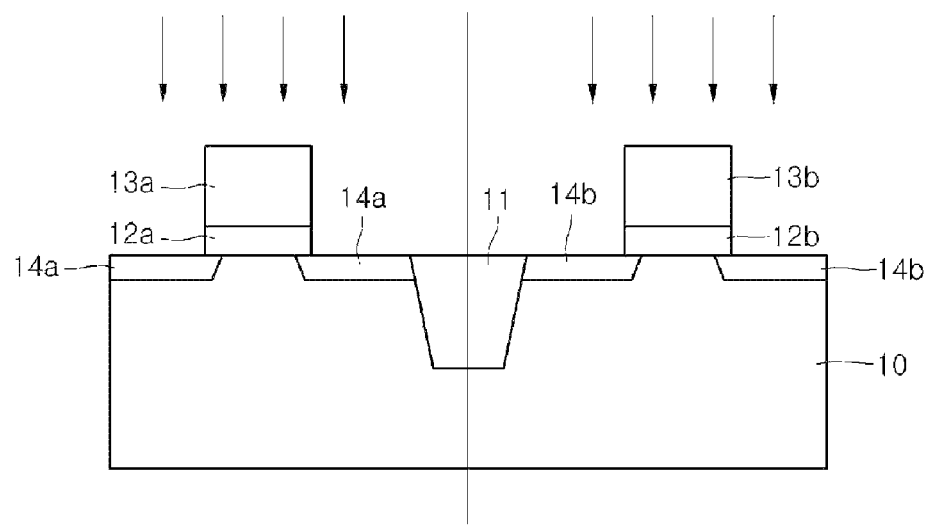
Figure 3:
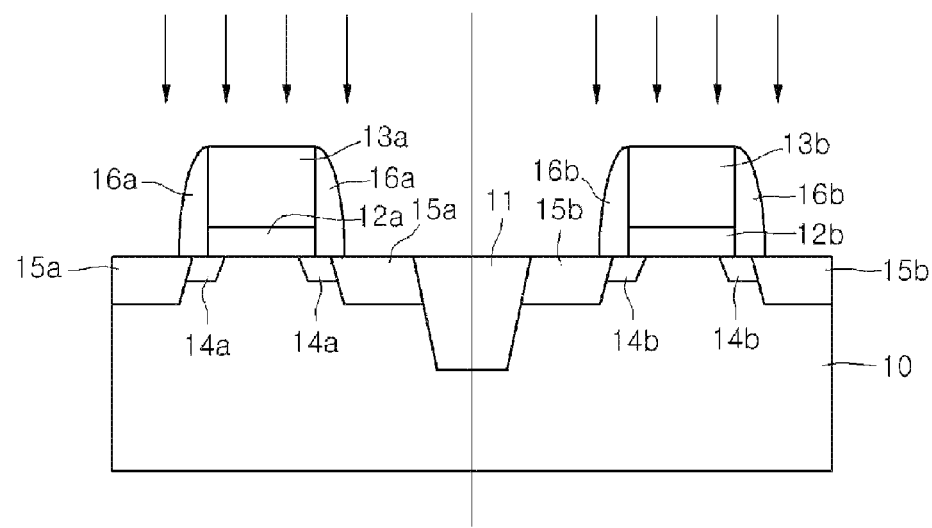
Figure 4:
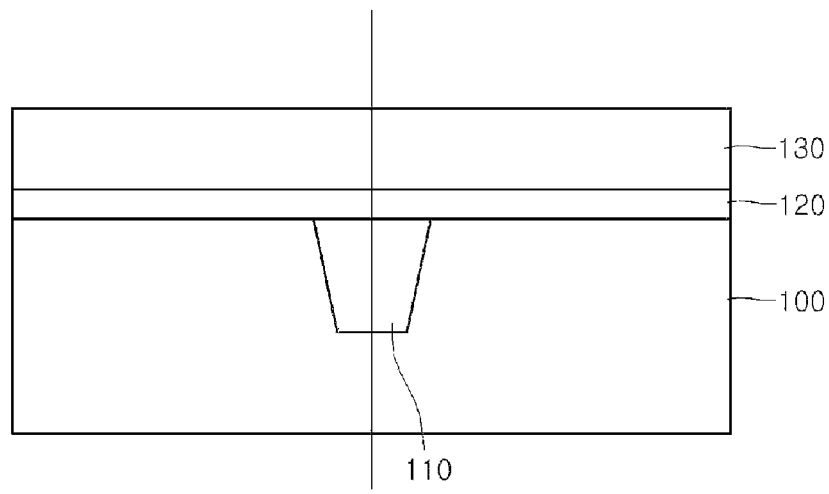
FIG. 4 is a cross-sectional view illustrating a form of an exemplary semiconductor device after a polysilicon layer is formed according to an embodiment.

FIG. 4 is a cross-sectional view illustrating a form of an exemplary semiconductor device precursor after a polysilicon layer 130 is formed according to various embodiment(s).

A trench is formed in the semiconductor substrate 100 of a material such as silicon, and an insulation layer is filled in the trench to form a device isolation region 110. The trench may be formed by photolithographic patterning and etching, and the device isolation region 110 may comprise a shallow trench isolation (STI) structure, including one or more silicon oxides (e.g., a thin silicon dioxide layer on the trench surface, formed by wet or dry thermal oxidation, and a bulk silicon dioxide layer filling the trench, formed by plasma-assisted CVD [e.g., high density plasma (HDP) CVD] and annealing to densify the bulk silicon dioxide material). Based on the device isolation region 110, one side of the semiconductor substrate 100 comprises a region where an N-type Metal Oxide Semiconductor (NMOS) device is to be formed, and the other side of the semiconductor substrate 100 comprises a region where a P-type MOS (PMOS) device is to be formed.

Well regions (not shown) for each type of MOS device are respectively formed in the NMOS region and the PMOS region of the semiconductor substrate 100, and then an insulation layer 120 and a polysilicon layer 130 are formed on the semiconductor substrate 100. The insulation layer 120 may comprise or consist essentially of $SiO_2$ (formed, e.g., by wet or dry thermal oxidation) or SiON (silicon oxynitride, formed by thermal oxidation and nitridization or by plasma CVD). The polysilicon layer 130 may be formed by plasma-assisted CVD from a silicon precursor such as silane ($SiH_4$). Next, ions of As and Sb are implanted in the polysilicon layer 130 in the NMOS region, and ions of B and In are implanted in the polysilicon layer 130 in the PMOS region in order to dope the polysilicon layer 130.

Figure 5:
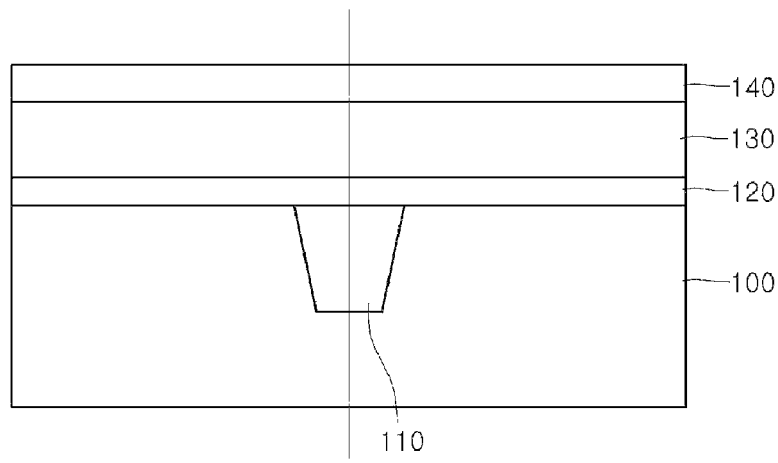
FIG. 5 is a cross-sectional view illustrating a form of an exemplary semiconductor device after a hard mask layer is formed according to another embodiment.

FIG. 5 is a cross-sectional view illustrating an exemplary precursor for an exemplary semiconductor device after a hard mask layer 140 is formed according to various embodiment(s).

Once the polysilicon layer 130 is formed, the hard mask layer 140 is formed thereon. The hard mask layer 140, which may comprise one or more layers of a silicon oxide (e.g., silicon dioxide) and/or silicon nitride, prevents the polysilicon layer 130 constituting a gate electrode from being etched when an etching process is performed later. The hard mask layer(s) 140 may be formed by CVD (e.g., plasma assisted CVD, as described herein).

Figure 6:
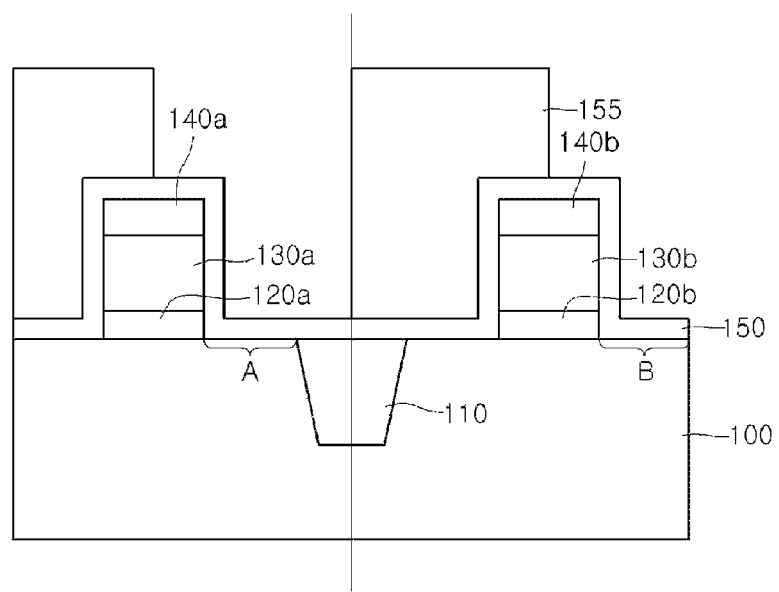
FIG. 6 is a cross-sectional view illustrating an exemplary semiconductor device after a second photoresist pattern is formed according to a further embodiment.

FIG. 6 is a side-sectional view illustrating an exemplary precursor for an exemplary semiconductor device after a second photoresist pattern 155 is formed according to various embodiment(s).

A first photoresist pattern (not shown) is formed on the hard mask layer 140 to define gate electrodes in the NMOS region and the PMOS region. Through an etching process, the insulation layer 120, the polysilicon layer 130, and the hard mask layer 140 are etched in reverse sequence. The insulation layer 120 may constitute an NMOS gate insulation layer 120a and a PMOS gate insulation layer 120b after etching. Additionally, the polysilicon layer 130 may constitute an NMOS gate electrode 130a and a PMOS gate electrode 130b after etching. Additionally, the hard mask layer 140 may constitute an NMOS hard mask 140a and a PMOS hard mask 140b after etching.

Later, the first photoresist pattern is removed, and a first spacer layer 150 is deposited on the semiconductor substrate 100 including the gate insulation layers 120a and 120b, the gate electrodes 130a and 130b, and the hard masks 140a and 140b. The first spacer layer 150 may comprise SiN and may be deposited using Low Pressure Chemical Vapor Deposition (LP-CVD).

Once the first spacer layer 150 is deposited, a second photoresist pattern 155 is formed to expose a portion A where an NMOS drain region is to be formed and a portion B where a PMOS drain region is to be formed.

Figure 7:
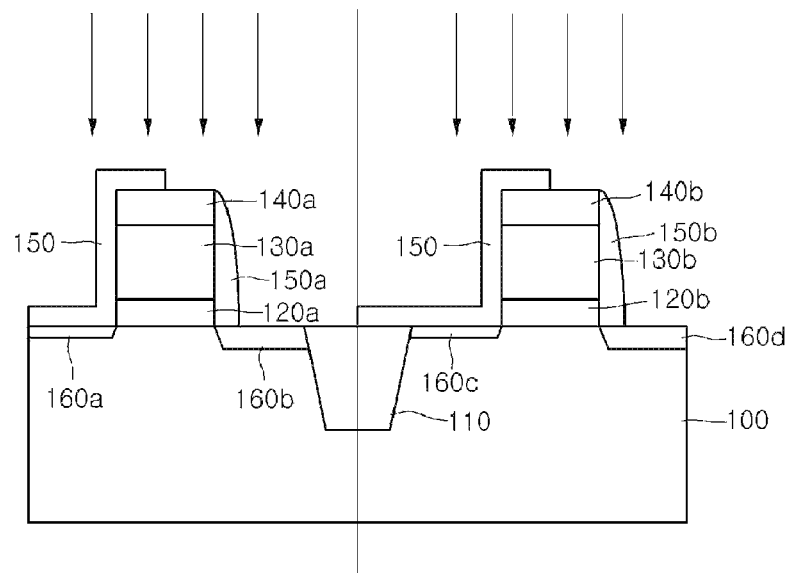
FIG. 7 is a cross-sectional view illustrating an exemplary semiconductor device after NMOS LDD regions and PMOS regions are formed according to yet another embodiment.

FIG. 7 is a cross-sectional view illustrating an exemplary precursor for an exemplary semiconductor device after NMOS LDD regions 160a and 160b and PMOS regions 160c and 160d are formed according to various embodiment(s).

From the structure shown in FIG. 6, an etching process is performed using the second photoresist pattern 155 as an etching mask. At this point, the etching process may comprise a dry (e.g., anisotropic) etching technique. Therefore, a portion of the first spacer layer 150 on the hard masks 140a and 140b, the first spacer layer 150 on the portions A and B where a drain region is to be formed, and the first spacer layer 150 at the NMOS side of the device isolation region 110 are removed.

Additionally, the first spacer layer 150 remains on the drain region (or a portion thereof) of the NMOS region and the sidewalls at the drain region of the NMOS gate insulation layer 120a, the NMOS gate electrode 130a, and the NMOS hard mask 140a, such that an NMOS first drain spacer 150a is formed. Additionally, the first spacer layer 150 remains on the drain region (or a portion thereof) of the PMOS region and the sidewalls at the drain region of the PMOS gate insulation 120b, the PMOS gate electrode 130b, and the PMOS hard mask 140b, such that a PMOS first drain spacer 150b is formed. At this point, the top portions of the NMOS first drain spacer 150a and the PMOS first drain spacer 150b may be partially etched to have a rounded form.

Next, the second photoresist pattern 155 is removed and one or more ion implantation processes are performed. For example, a photoresist mask (not shown) may be formed by photolithography over the NMOS region before implanting ions into the PMOS region, and a separate photoresist mask (not shown) may be formed by photolithography over the PMOS region before implanting ions into the NMOS region. Therefore, an LDD region 160a of the NMOS source region, an LDD region 160b of the NMOS drain region, an LDD region 160c of the PMOS source region, and an LDD region 160d of the PMOS drain region are formed.

When the ion implantation process is performed, the first spacer layer 150 of the NMOS source region and the first spacer layer 150 of the PMOS source region, which are not etched as a result of the second photoresist pattern 155, partially prevent ions from being implanted. Accordingly, the LDD region 160a of the NMOS source region and the LDD region 160c of the PMOS source region may have (or be formed with) a shallower depth than the LDD region 160b of the NMOS drain region and the LDD region 160d of the PMOS drain region. That is, according to the exemplary process, an asymmetric LDD structure can be formed.

Additionally, even if the LDD regions 160a, 160b, 160c, and 160d may diffuse into or under the gate electrodes 130a and 130b, because of the first drain spacers 150a and 150b and the first spacer layer 150 remaining on the source region, the diffusion region is restricted such that the overlap phenomenon of the LDD regions 160a, 160b, 160c, and 160d and the gate electrodes 130a and 130b can be reduced, minimized or prevented.

The NMOS LDD regions 160a and 160b may be formed by implanting ions such as As and/or Sb. At this point, a pocket implantation process may be further performed using $BF_2$ ions.

Additionally, the PMOS LDD regions 160c and 160d may be formed by implanting ions such as B and/or In. At this point, a halo implantation process may be further performed using ions such as As and/or Sb.

Figure 8:
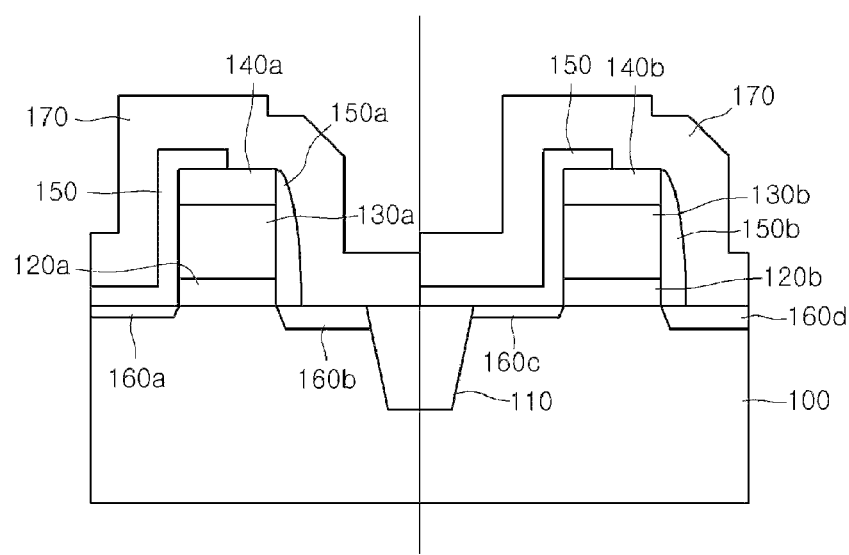
FIG. 8 is a cross-sectional view illustrating an exemplary semiconductor device after a second spacer layer is formed according to various embodiments.

FIG. 8 is a cross-sectional view illustrating an exemplary precursor for an exemplary semiconductor device after a second spacer layer 170 is formed according to various embodiments.

Next, a second spacer layer 170 is formed on the semiconductor substrate 100 including the remaining first spacer layer 150, the hard masks 140a and 140b, the NMOS first drain spacer 150a, the PMOS first drain spacer 150b, the LDD region 160b of the NMOS drain region, the LDD region 160d of the PMOS drain region, and a portion of the device isolation region 110. The second spacer layer 170 may comprise SiN and/or $SiO_2$, and may be deposited by CVD (which may be plasma assisted).

Although the second spacer layer 170 is deposited with the same thickness (e.g., conformally), since an asymmetric structure of the reaming first spacer layer 150, NMOS first drain spacer 150a, and PMOS first drain spacer 150b is reflected, the second spacer layer 170 has an asymmetric structure with respect to the source region and the drain region of a given NMOS or PMOS device.

Figure 9:
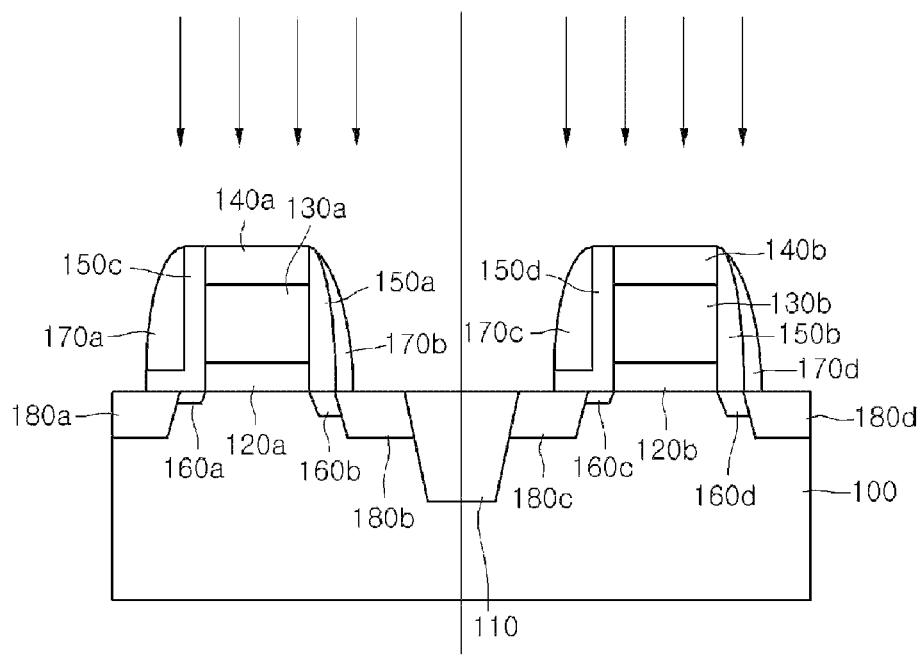
FIG. 9 is a cross-sectional view illustrating an exemplary semiconductor device after NMOS spacers and PMOS spacers are completed.

FIG. 9 is a cross-sectional view illustrating an exemplary precursor for an exemplary semiconductor device after NMOS spacers 150a, 150c, 170a, and 170b and PMOS spacers 150b, 150d, 170c, and 170d are completed.

Next, an etching process without a photoresist pattern (for example, a blanket etching process) is performed to complete a spacer structure according to one or more embodiments. Through the blanket etching process, the second spacer layer 170 and the remaining first spacer layer 150 on the NMOS hard mask 140a and the PMOS hard mask 140b are partially removed. Additionally, the first spacer layer 150 remaining on the sidewalls at the source region of the NMOS gate insulation layer 120a, the NMOS gate electrode 130a, the NMOS hard mask 140a, and the second spacer layer 170 are partially etched to form NMOS first and second source spacers 150c and 170a, respectively. Additionally, the second spacer layer 170 next to the NMOS first drain spacer 150a is etched at the same time to form an NMOS second drain spacer 170b. In the same manner, the first spacer layer 150 remaining on the sidewalls at the source region of the PMOS gate insulation layer 120b, the PMOS gate electrode 130b, and the PMOS hard mask 140b, and the second spacer layer 170 are partially etched to form PMOS first and second source spacers 150d and 170c, respectively. That is, the second source spacers 170a and 170c are formed on the top and side of the first source spacers 150c and 150d, respectively. Additionally, the second spacer layer 170 next to the PMOS first drain spacer 150b is etched at the same time to form a PMOS second drain spacer 170d. The first spacer layer 150 and the second spacer layer 170 remaining on other than the above portions are removed.

The structure of the first spacers 150a, 150b, 150c, and 150d, and the second spacers 170a, 170b, 170c, and 170d of the NMOS and PMOS regions utilizes etching characteristics of a dry (e.g., anisotropic) etching process.

Next, using the first spacers 150a, 150b, 150c, and 150d, the second spacers 170a, 170b, 170c, and 170d, the hard masks 140a and 140b, and the device isolation region 110 as an ion implantation mask, one or more ion implantation processes are performed to form source regions 180a and 180c and drain regions 180b and 180d in the NMOS region and the PMOS region, respectively. For example, a photoresist mask (not shown) may be formed by photolithography over the NMOS region before implanting ions into the PMOS region, and a separate photoresist mask (not shown) may be formed by photolithography over the PMOS region before implanting ions into the NMOS region.

Once the source regions 180a and 180c and the drain regions 180b and 180d are formed, a thermal treatment process such as Laser Spike Anneal (LSA) and/or Rapid Thermal Anneal (RTA) is performed to activate the source regions 180a and 180c and the drain regions 180b and 180d.

The semiconductor device and the method of manufacturing the same according to the embodiments use two regions of the PMOS region and the NMOS region as one example, but can be apparently applied to a semiconductor region of more than two regions or a single semiconductor region.

Figure 10:
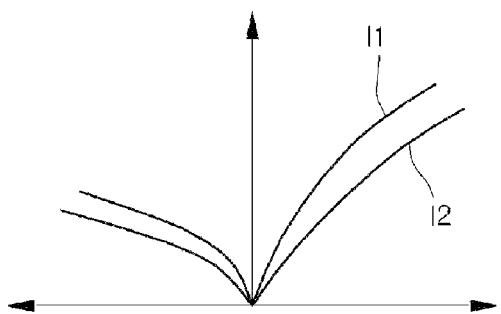
FIG. 10 is a graph when a drive current characteristic of an exemplary semiconductor device is measured according to one or more embodiments.

FIG. 10 is a graph of a drive current characteristic of a semiconductor device, measured according to one or more embodiments.

In the graph of FIG. 10, the x-axis represents a drive voltage V, and the y-axis represents a drive current (in $\mu A/\mu m$). Additionally, measurement line 11 represents a current characteristic of the semiconductor device according to an exemplary embodiment of the invention, and measurement line 12 represents a current characteristic of a related art symmetric semiconductor device. Referring to FIG. 10, if the same drive voltage is applied, it is confirmed that the drive current of a semiconductor device according to the present invention is increased more than the symmetric semiconductor.

According to various embodiments of the invention, the following effects can be achieved.

First, through an asymmetric LDD structure and an asymmetric double spacer structure, one or more sub-threshold characteristics of a semiconductor device can be maximized, and the flow of a drive current can be improved in an inversion mode.

Second, through the double spacer structure, the profile of an underlying LDD region can be finely controlled. Additionally, a self-aligned asymmetric LDD structure can reduce, suppress or minimize an overlap phenomenon between the gate and the LDD region. Accordingly, a swing characteristic of the semiconductor device can be improved, and a propagation delay time can be minimized.

Third, since characteristics of GIDL and DIBL can be improved and a propagation delay time of the device can be minimized, the operational speed of the semiconductor device can be improved and operational reliability can be increased.

Any reference in this specification to "one embodiment", "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is within the purview of one skilled in the art to effect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a semiconductor device, the method comprising:
    forming a gate electrode on a semiconductor substrate having a device isolation region, wherein forming the gate electrode comprises forming an insulation layer on the semiconductor substrate, forming a polysilicon layer on the insulation layer, forming a hard mask layer on the polysilicon layer, and patterning the insulation layer, the polysilicon layer, and the hard mask layer to form a gate insulation layer, the gate electrode, and a hard mask, respectively;
    forming a first drain spacer on sidewalls of the gate insulation layer, the gate electrode, and the hard mask on one side of the gate electrode and forming a first spacer layer on an opposite side of the gate electrode and on the semiconductor substrate where a source region is to be formed;
    forming an asymmetric Lightly Doped Drain (LDD) region by implanting ions into the exposed semiconductor substrate next to the first drain spacer and implanting ions through the first spacer layer; and
    forming a second drain spacer next to the first drain spacer, partially removing the first spacer layer on the semiconductor substrate where the source region is to be formed to form a first source spacer on sidewalls of the gate insulation layer, the gate electrode, and the hard mask, and forming a second source spacer on side and top surfaces of the first source spacer.

2. The method according to claim 1, further comprising:
    forming a source region in the semiconductor substrate next to the second source spacer and forming a drain region in the semiconductor substrate next to the second drain spacer through an ion implantation process.

3. The method according to claim 1, wherein:
    the semiconductor substrate comprises an N-type Metal Oxide Semiconductor (NMOS) region and a P-type MOS (PMOS) region on opposite sides of the device isolation region; and
    the gate electrode, the first drain spacer, the second drain spacer, the first source spacer, the second source spacer, and the LDD region are formed in each of the NMOS region and the PMOS region.

4. The method according to claim 1, wherein forming the first drain spacer and the first spacer layer comprises:
    forming the first spacer layer on the entire semiconductor substrate including the gate insulation layer, the gate electrode, and the hard mask; and
    forming the first drain spacer on the one side of the gate insulation layer, the gate electrode, and the hard mask by etching an exposed region of the first spacer layer and masking the first spacer layer on the opposite side of the gate insulation layer, the gate electrode, and the hard mask, and on a portion of the semiconductor substrate where the source region is to be formed.

5. The method according to claim 1, wherein forming the second source spacer comprises:
    forming a second spacer layer on the semiconductor substrate including the first drain spacer, the first spacer layer, the hard mask, and the LDD region; and
    etching the second spacer layer to form the second drain spacer near the first drain spacer and form the second source spacer on side and top surfaces of the first spacer, and etching exposed portions of the first spacer layer to form the first source spacer.

6. The method according to claim 1, wherein forming the polysilicon layer comprises doping the polysilicon layer by implanting ions including at least one of As, Sb, B, and In.

7. The method according to claim 4, wherein the first spacer layer is etched by a dry etching technique.

8. The method according to claim 5, wherein at least one of the first spacer layer and the second spacer layer comprises SiN.

9. The method according to claim 5, wherein the etching process comprises a blanket etching process using a dry etching technique.

10. The method according to claim 4, wherein forming the first spacer layer comprises a Low Pressure Chemical Vapor Deposition (LP-CVD) technique.

11. The method according to claim 1, wherein forming the first spacer layer comprises forming a portion of the first spacer layer on an uppermost surface of the LDD region and the sidewalls of the gate insulation layer, the gate electrode and the hard mask of the NMOS and the PMOS regions, respectively.

12. The method according to claim 1, wherein forming the asymmetric LDD regions comprises forming a first LDD region at a first depth in the NMOS region, and forming a second LDD region at a second depth greater than the first depth in the PMOS region.

* * * * *